United States Patent [19]

Lowe et al.

[11] 4,302,311

[45] Nov. 24, 1981

[54] SPUTTER COATING OF MICROSPHERICAL SUBSTRATES BY LEVITATION

[75] Inventors: Arthur T. Lowe, Tempe, Ariz.; Charles D. Hosford, Los Alamos, N. Mex.

[73] Assignee: The United States of America as represented by the United States Department of Energy, Washington, D.C.

[21] Appl. No.: 95,681

[22] Filed: Nov. 19, 1979

[51] Int. Cl.³ ............................................. C23C 15/00
[52] U.S. Cl. ................................ 204/192 R; 204/298; 428/406
[58] Field of Search ............. 204/192 R, 298; 118/62; 427/212, 217; 428/406, 433

[56] References Cited

U.S. PATENT DOCUMENTS

| | | | |
|---|---|---|---|
| 1,833,640 | 11/1931 | Fruth | 204/192 |
| 2,833,241 | 6/1958 | Crowley et al. | 118/62 |
| 3,189,535 | 6/1965 | Webb | 204/298 |
| 3,241,520 | 3/1966 | Wurster et al. | 118/62 |
| 3,264,073 | 8/1966 | Schmitt | 29/182 |
| 3,514,388 | 5/1970 | Brumfield et al. | 204/192 |
| 3,664,942 | 5/1972 | Havas et al. | 204/192 |
| 3,892,651 | 7/1975 | Salisbury et al. | 204/192 |
| 4,039,297 | 8/1977 | Takenaka | 428/566 |
| 4,133,854 | 1/1979 | Hendricks | 264/10 |

OTHER PUBLICATIONS

J. Vossen and W. Kern, Thin Film Processes, Academic Press, New York, 1978, pp. 115-121.
G. A. Farnell et al., "A levitation Technique . . . ", J. Phys. E Sci. Instr., vol. 6, 137-138 (1973).
G. A. Farnell et al., "Studies of Levitation Technique . . . ", ICP Information Newsletter, vol. 3, No. 7, 284-289 (Dec. 1977).
"Laser Program Annual Report-1975", Lawrence Livermore Laboratory, Univ. of California, UCRL-500-21-75, pp. 339-363.
A. Mayer et al., "Plating Discrete Microparticles . . . ", Plating and Surface Finishing, Mar. 1978, pp. 42-46.
W. J. McCreary, "Microspherical Laser Targets by CVD", Proceedings of Conference on CVD, Fifth Int. Conf., Electrochemical Society, 1975, pp. 714-725.
A. Mayer et al., "Electrolytic Coating of Micro-Particles . . . "Los Alamos Report LA-6584, Apr. 1977.

Primary Examiner—Delbert E. Gantz
Assistant Examiner—William Leader
Attorney, Agent, or Firm—Elizabeth O. Slade; Paul G. Gaetjens; Richard G. Besha

[57] ABSTRACT

Microspheres are substantially uniformly coated with metals or nonmetals by simultaneously levitating them and sputter coating them at total chamber pressures less than 1 torr. A collimated hole structure 12 comprising a parallel array of upwardly projecting individual gas outlets 16 is machined out to form a dimple 11. Glass microballoons, which are particularly useful in laser fusion applications, can be substantially uniformly coated using the coating method and apparatus.

8 Claims, 4 Drawing Figures

SPUTTER COATING OF MICROSPHERICAL SUBSTRATES BY LEVITATION

BACKGROUND OF THE INVENTION

FIELD OF THE INVENTION

This invention relates in general to a method and apparatus for coating microspheres with metals or non-metals and relates in particular to a method and apparatus for coating microspheres made of glass. It is a result of a contract with the Department of Energy (W-7405-ENG-36).

The coating requirements for laser fusion targets have led to the need for development of new technologies for depositing a wide range of materials. Laser-driven fusion requires efficient coupling of laser energy to the deuterium-tritium fuel (hereinafter called DT). Although the power of present laser systems is very high, the energy per pulse is small; this requires that targets be correspondingly small, in fact, microscopic. The DT is frequently contained in a glass microballoon (hereinafter called a GMB), having a mass of less than 1 microgram ($\mu$g), a diameter of about 50-500 micrometers ($\mu$m), with a wall thickness of about 1-2 $\mu$m. A need has arisen for a method of coating these microballoons with plastics and high- and low-atomic number metals, with a substantially uniform thickness within the range from about 0.1 to 100 $\mu$m.

For such depositions, the microspheres must be kept in motion to obtain uniform coatings. Techniques of coating GMB's which have been employed until now have had at least one of the following problems: high breakage loss of GMB's, sticking together (i.e., cold welding) of GMB's, and collection of particulates on GMB's during the coating process.

PRIOR ART

Macroscopic bodies have been coated by producing motion of those bodies by a variety of means including (a) use of a rotating drum, as in Brumfield et al., U.S. Pat. No. 3,514,388, and in Salisbury, U.S. Pat. No. 3,892,651; (b) use of an inclined plane as in Fruth, U.S. Pat. No. 1,833,640; (c) use of a vibrating armature as in Webb, U.S. Pat. No. 3,189,535; and (d) use of levitation, as in Crowley, U.S. Pat. No. 2,883,241, wherein spherical objects such as golf balls are levitated in a high velocity gas stream and are simultaneously coated by spray coating, and in Wurster et al., U.S. Pat. No. 3,241,520, wherein a large number of discrete particles (for example, pharmaceutical tablets) are suspended by and coated in a gas stream. In Wurster and Crowley, the named objects being coated are orders of magnitude larger than microspheres; there is no teaching of coating microspheres, and in particular not at very low pressures.

Coating of microscopic bodies, on the other hand, involves a whole set of problems which is not even addressed by, much less solved by, methods of coating macroscopic bodies. When the masses of such particles are on the order of micrograms, there are severe problems in controlling the particles, a small puff of gas being sufficient to blow the particles away from the coating region. Additionally, when the microsphere has a very large charge to mass ratio (as has a GMB), severe problems due to static electricity are encountered. Such problems do not suggest the advisability of coating microspheres (particularly GMB's) by using levitation, although some experiments have been done by others on levitation of microspheres at atmospheric pressure over a collimated hole structure in which a dimple (i.e., indentation) was carved. However, because it generally becomes increasingly difficult to levitate bodies as the surrounding gas pressure is reduced, coating microspheres at reduced pressures below 1 torr is even more unlikely to be done.

OBJECTS OF THE INVENTION

It was an object of this invention to coat microspheres with any of a variety of coatings such that the coating would be substantially uniform and have minimal surface imperfections.

Another object of this invention was to coat a glass microballoon housing DT with a uniform coating.

Another object of this invention was a method of coating microspheres in which breakage, adherence of particulates, and cold welding to other microspheres would be minimized.

Another object of this invention was an apparatus suitable for uniformly coating microspheres.

Other objects, advantages, and novel features of the invention will become apparent to those skilled in the art upon examination of the following detailed description of the preferred embodiments of the invention and the accompanying drawings.

SUMMARY OF THE INVENTION

According to the invention, a method for coating microspheres with a substantially uniform coating of at least one coating material selected from the group consisting of metals and non-metals comprises: levitating a microsphere at an extremely low total pressure (well below 1 torr) above a collimated hole structure (CHS) comprising a multiplicity of upwardly directed gas jet outlets aligned in parallel, the upper extremities of which form a dimple in which the microsphere levitates and rotates while it is being coated; and (2) simultaneously operating a sputtering deposition. In a preferred embodiment, the microsphere is a hollow glass microballoon (GMB) suitable for housing deuterium-tritium fuel for use in laser fusion; and the flow rate of the levitation gas and the total chamber pressure (i.e., sputtering pressure) are adjusted so as to maintain the GMB during coating at a height above the bottom of the CHS which is between about $\frac{1}{2}$ and about 1 times the diameter of the GMB.

Also according to the invention, an apparatus suitable for uniformly coating a microsphere comprises:

(1) a collimated hole structure comprising a parallel array of a multiplicity of upwardly projecting gas jet outlets, the upper extremities of which form a dimple;

(2) a sputtering means for sputtering a coating material, said sputtering means being located above said dimple;

(3) a means for supplying a levitating gas through said parallel array of gas jets so as to levitate a microsphere above said dimple;

(4) a housing for enclosing the 3 above-recited apparatus elements; and (5) a vacuum means for reducing the total pressure within said housing well below 200 m Torr.

Also according to the invention, in a preferred embodiment, a viewing system comprising a laser for illuminating a microsphere while it is being coated, mirrors, a telescope, a television camera, and a television monitor are used to monitor a microsphere while it is being coated in the above-described coating apparatus.

BRIEF DESCRIPTION OF THE DRAWINGS

FIGS. 1, 2, and 4 are schematic illustrations of a microsphere (not shown to scale) while it is being levitated within a dimple in a CHS.

DESCRIPTION OF THE PREFERRED EMBODIMENTS

The invention satisfies the above-listed objects and exhibits the following advantages. Microspheres on the order of 1/10 mm in diameter and even smaller can be coated with a substantially uniform coating using the method and apparatus of the invention. Because the technique of sputtering is used to deposit that coating, the coating adheres very well to the surface of the microsphere. When it is desired to coat a hollow microsphere made of glass for use in holding DT for laser fusion work and when the microsphere is coated in the method of this invention by using sputtering and levitation, the sphere can (and should) be carefully watched throughout the period of coating. This monitoring capability is of great importance in laser fusion work. Although static electricity has been found to be a serious problem when coating glass microspheres, that problem has been substantially reduced, as described below. When the pressure in the coating chamber is within the range as described below, both good control over the microsphere and a good coating rate are achieved.

Figure 1:
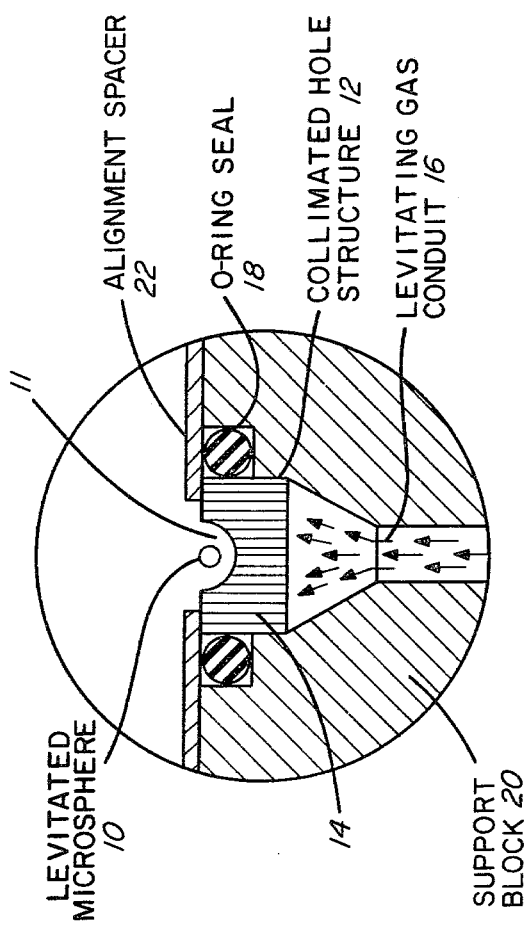
Figure 2:
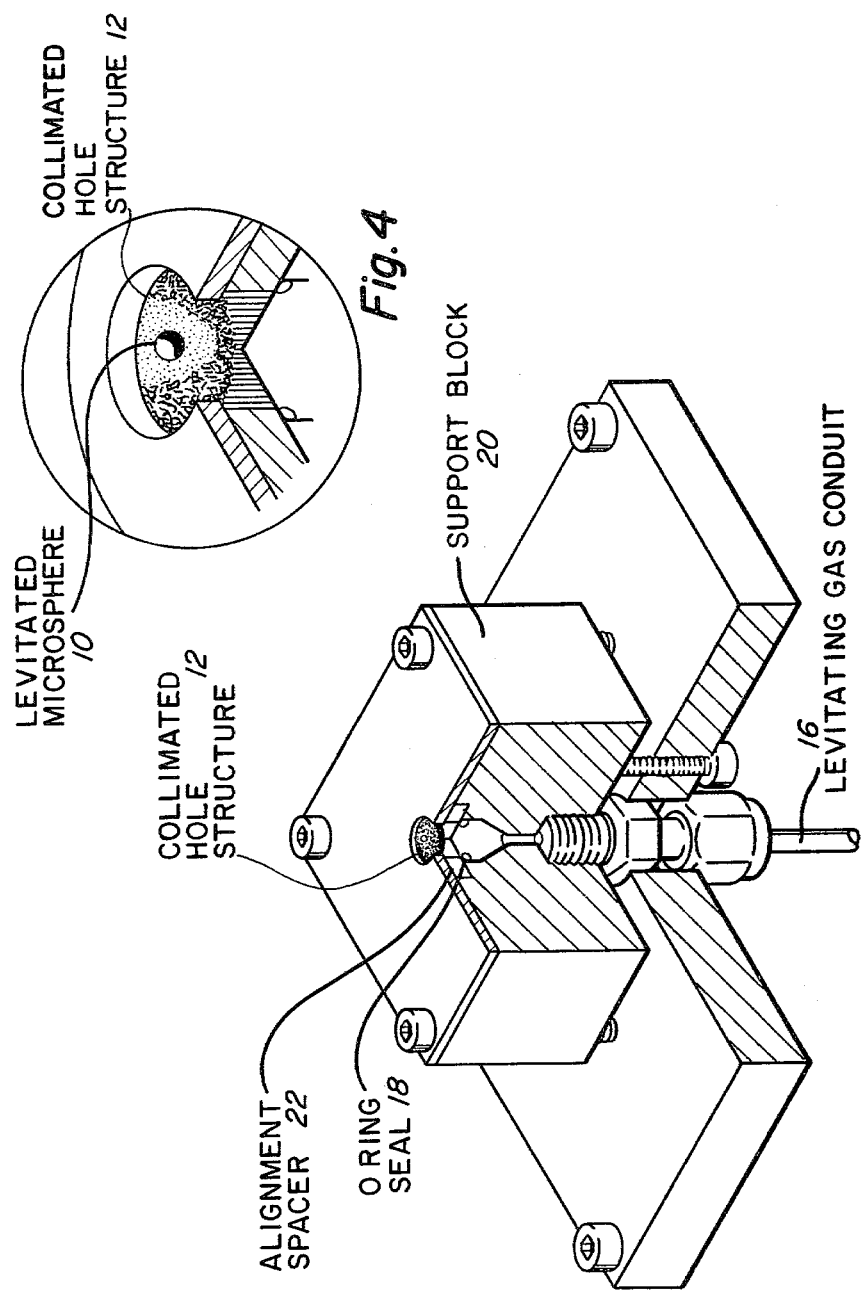

Referring to the drawing, in FIGS. 1, 2, and 4, microsphere 10 is shown levitated above a dimple 11 in collimated hole structure 12, which comprises an array of individual tiny linear gas outlets 14 aligned in parallel. Levitating gas conduit 16 supplies levitating gas to CHS 12. O-ring seal 18 seals CHS 12 within support block 20. Alignment spacer 22 can be used to level support block 20 so that the levitating gas streams upwardly.

Figure 3:
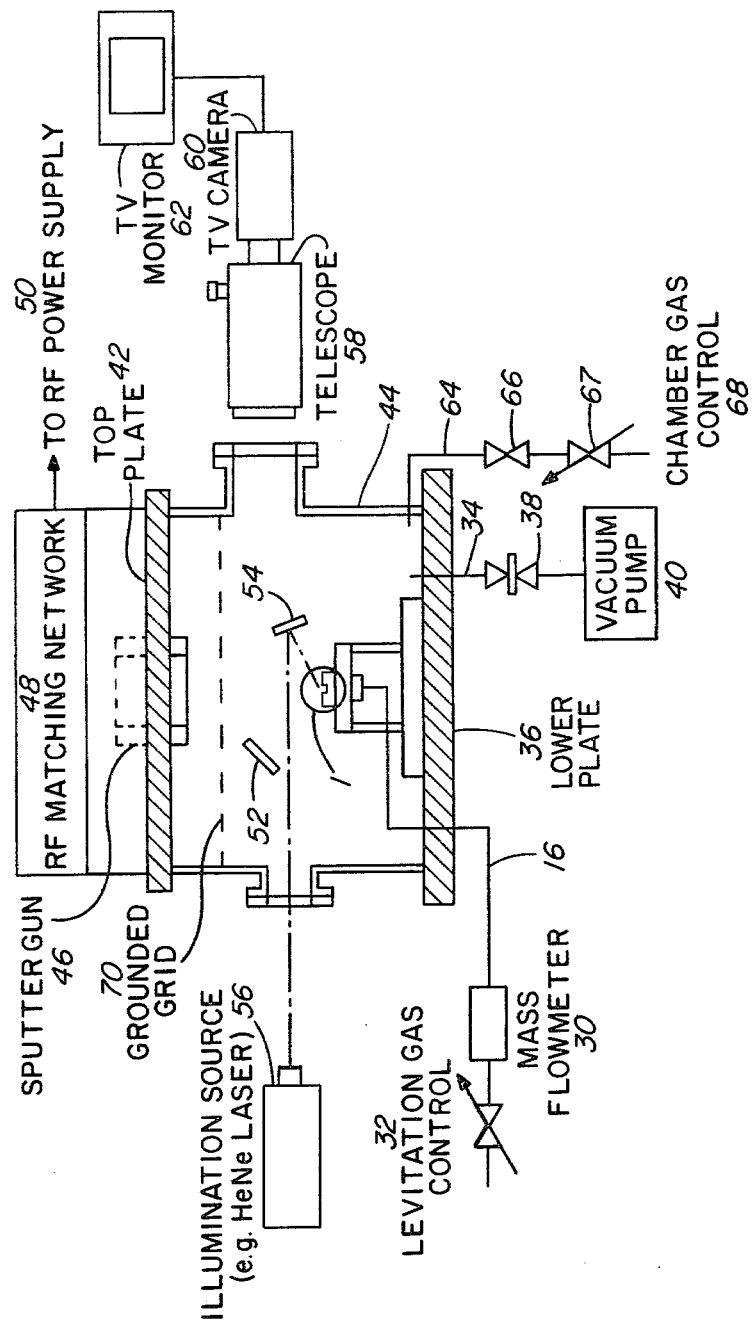
FIG. 3 is a schematic illustration of an embodiment of apparatus suitable for levitating and sputter coating a microsphere.

In FIG. 3, the structures shown in FIGS. 1 and 2 are shown, together with other apparatus which is used to coat microspheres in the method of the invention. Levitating gas conduit 16 houses mass flowmeter 30 and levitation gas control 32. Conduit 34 intersects lower plate 36, houses valve 38, and leads to vacuum pump 40. Lower plate 36 forms the bottom of and top plate 42 forms the top of evacuated housing 44. Top plate 42 has an orifice therein (not shown), which houses the target material, at which the nozzle of the sputtering means 46 is directed. Through the orifice, sputtered material propels down into evacuated housing 44. Sputtering means 46 operates in cooperation with rf matching network 48 and rf power supply 50.

Within evacuated housing 44, mirrors 52 and 54 are aligned so that illumination source (e.g., He Ne laser) 56 can be used to illuminate levitated microsphere 10 and so that telescope 58 can be used to observe levitated microsphere 10. TV camera 60 is used in cooperation with telescope 58 so that the motion of levitated microsphere 10 can be observed on TV monitor 62.

Conduit 64 intersects evacuated housing 44 and contains shutoff valve 66 and needle valve 67, these two valves comprising chamber gas control 68. Through chamber gas control 68, sputtering gas is added to the coating chamber.

Grounded grid 70 is located between sputtering means 46 and levitating microsphere 10.

In operation, a microsphere 10 is placed within dimple 11 of collimated hole structure 12. Vacuum pump 40 is turned on. After pumpdown to $1 \times 10^{-6}$ mTorr, the pressure is raised in chamber 44 to 200 mTorr with chamber gas control 68. Levitation gas control 32 is adjusted so that the levitation gas enters housing 44 at a quite slow initial rate (described below). Sputtering means 46, rf matching network 48, and rf power supply 50 are turned on; and rf power supply 50 is adjusted so that initially the power is relatively low. Chamber gas control 68 is adjusted to add more sputtering gas if necessary so that the total chamber pressure is within the range specified below. The sputtering gas is ionized and the ionized gas (i.e., plasma) strikes a target material (not shown), for example gold, and ejects neutral atoms of that target material. These atoms are propelled down onto levitating and rotating microsphere 10, thus coating the microsphere with the target material. The motion of the levitating microsphere can be observed by use of telescope 58, TV camera 60, and TV monitor 62, the illumination source 56 being used to penetrate the plasma and to illuminate levitating microsphere 10. Grounded grid 70 is placed as shown to counter the effect of the plasma on levitating microsphere 10.

The motion of microsphere 10 is affected by the falling target material atoms, by the plasma, by the flow rate of the levitation gas, and by the total chamber pressure (also called sputtering gas pressure) which is governed by vacuum pump 40, by chamber gas control 68 and by the levitating gas flow rate.

These variables must be carefully adjusted, particularly when an object having a high charge-to-mass ratio is being coated.

In the practice of the invention, microspheres are coated. This category generally includes objects having a diameter less than about 500 $\mu$m.

The microspheres can be made of any material which is compatible with the coating material to be deposited thereon; and they can be either hollow or solid, as desired.

The mass of the microspheres can vary widely, although it is much easier to control a heavier object being levitated than it is to control a lighter object.

As described above, a particularly useful microsphere for use in laser fusion is hollow and made of glass. The mass of an uncoated GMB will be often only about 1/10 of a microgram; and it has a very high charge to mass ratio.

In the practice of the invention, levitation of a microsphere with the simultaneous application of a sputtered coating are required.

It has been found that when GMB's (as described above) are coated in the method of the invention, the GMB must be levitated at a particular height (i.e., between about 2 and about 3 GMB diameters) above the bottom of the collimated hole structure before the sputter gun is turned on and must be maintained during a coating run at a particular height (i.e., about ½ to about 1 GMB diameter) above the bottom of the collimated hole structure. These heights have been experimentally determined to be required in order that the GMB be maintained in its levitation over the dimple, instead of flying off or sticking to the dimple. These heights provide space for the GMB to move down into when the plasma and/or target material exert forces on the GMB. For microspheres other than GMB's which are to be coated by sputter coating and levitation, this height would generally be varied. For example, see example 4.

In the practice of the invention, for levitating microspheres, a collimated hole structure comprising an array of a multiplicity of minuscule gas jet outlets aligned in parallel is used. The size of the individual gas outlets is important. For GMB's having diameters within the range from about 100 μm to about 500 μm, it was found that better coating results were obtained when the diameters of the gas outlets were 50 μm than when they were 10 μm or 100 μm. A suitable CHS can be purchased from Brunswick Corp.

In the CHS, a dimple (i.e., an identation) is hollowed out from the CHS. The shape and the dimensions of the dimple can vary quite widely. However, a substantially regular shape is preferred so as to obtain better control over the microsphere while it is being levitated. Examples of such shapes are substantially hemispherical, cylindrical, and conical shapes.

The depth of the dimple should be substantially uniform over the area of the dimple for maximum stability of the levitating microsphere. Generally, it has been found that the deeper the dimple, the better the stability. However, because the height of the GMB above the bottom of the dimple must be monitored, a limit on the depth exists. For obtaining a proper perspective of the levitating GMB in the dimple, the angle formed between the horizontal and the line of sight should not be greater than about 38°.

If desired, more than one dimple can be carved into a CHS and more than one CHS can be used.

The levitating gas flow rate should be selected so as to levitate the microsphere being coated within a dimple. This flow rate can vary broadly, depending upon the mass of the microsphere being coated. Furthermore, as the coating progresses, in order to maintain the levitation of the microsphere it is necessary to increase the levitation gas flow rate gradually.

The type of gas used to levitate the microsphere should be selected so that it does not react either with the coating material or with any other substance located within the coating chamber. Therefore, it is preferred to use an inert gas or gases as the levitating gas. It has been found that argon gives the best results and is preferably used both as the levitating gas and as the sputtering gas.

For coating GMB's, the levitating gas flow rate will be generally within the range from about 0.1 to about 0.2 cm$^3$/minute at the beginning of coating.

In sputter coating, atoms (or groups of atoms) are ejected from the surface of a cathode by accelerated heavy ions (i.e., plasma) which strike the cathode. Any apparatus suitable for producing this sputter coating can be used in the practice of the invention. A suitable apparatus is a Sloan Sputter Gun ®, operated in combination with a suitable rf matching network and rf power supply.

Sputter coating enables one to coat articles with either metals or nonmetals; and the coating material adheres much better to the surface of the article being coated than does material deposited by simple evaporation. However, despite these advantages, using a sputtering means creates serious problems. When a sputtering means produces a plasma, the containment of that plasma by the sputtering means is incomplete; and that plasma exerts a force due to its charge on the microspheres being coated. This force can cause the levitating microspheres to strike and stick to the CHS. Furthermore, when a sputtering means is used, the total pressure in the coating chamber must be lower than about 200 millitorr (mTorr) in order for the sputtering means to operate at all. As stated above, levitation becomes increasingly difficult as this pressure is lowered. It has been found that the total pressure in the coating chamber must be above about 30 mTorr in order for a levitating GMB to be stable. However, it has been found that as the total pressure is increased in the coating chamber above about 5 mTorr, the deposition rate of coated material decreases. Thus, GMB's coated by sputter coating must be coated at very low pressures; and for coating GMB's at a relatively fast sputter coating rate, the total chamber pressure must be within the narrow range of about 30 to about 90 mTorr.

Additionally, the rf power level must be carefully adjusted when coating GMB's. As the power level is turned up, more plasma is produced, causing more of an interference with the microsphere being coated. In order to reduce this problem, the sputtering means should be operated at a low power level. Generally, sputtering means are operated at power levels within the range from about 300 to about 600 watts. Thus, one should operate the power level of such a sputtering means (at least initially) as close to 300 watts as possible and preferably not above about 500 W. Additionally, a grounded grid 70 is preferably placed between the sputtering means and the microsphere being coated, as illustrated in FIG. 3.

A vacuum pump 40 is required to achieve the low pressures required for sputter coating (as described above) and to keep the vacuum chamber relatively clean so as to prevent the deposition of any extraneous material onto the microspheres as they are being coated. Any vacuum pump suitable for carrying out these purposes can be used.

The coating material (i.e., the target material which the plasma strikes) can be any metal or non-metal which is sputterable. Examples of some suitable metals which have been satisfactorily coated onto levitating microspheres are gold, molybdenum, and aluminum. The invention is not to be limited by these enumerated examples, however.

When coating GMB's, a suitable technique for reducing the problem of static charge is to sputter onto the GMB's a thin (for example 200–500 Å) metallic layer while the GMB's are lying on a flat surface prior to levitation, then to store them in metal containers, and then to treat them with a commercial electrostatic eliminating device.

Initial lift-off of a glass microballoon from the CHS is often difficult due to static charging of the GMB. Increasing the levitating gas flow sufficiently to lift the microsphere was not acceptable because this procedure would often blow the GMB away. A satisfactory solution was to use an electromechanical driver such as a Bruel and Kjair Minishaker, attaching this to the CHS so as to vibrate the structure sufficiently to dislodge the GMB gently and permit lift-off at low gas flow rates.

Thus, a suitable method for sputter coating GMB's by levitation is the following. The GMB's are preliminarily coated statically with 300 Å of metal to reduce static charges. Next, one GMB is placed with a dimple. The vacuum should be turned on next and gradually pumped down to about $10^{-6}$ torr. Next, the total coating chamber pressure (sputtering pressure) is adjusted so that it is relatively high, (as high as about 200 mtorr±about 10%) by adding, if needed, additional gas by adjusting chamber gas control 68. The levitating gas is next started and the height of the GMB above the bottom of the dimple is adjusted to about 2-3 GMB diameters. Next, the sputtering means is started at a relatively low rf power level, for example about 300 watts. The GMB is carefully watched while it is being coated so that its height above the bottom of the CHS is maintained at about ½ to about 1 GMB diameter. If desired, this monitoring of the height could be automated.

As the coating proceeds, the rf power level can be gradually increased if desired in order to increase the deposition rate, provided that the height of the GMB above the bottom of the CHS stays within the range as described above. Additionally, the total chamber pressure can be lowered as the coating proceeds, thus allowing the sputtering deposition rate to be increased. As coating proceeds, however, the levitating gas flow rate must be gradually increased in order to maintain the levitation of the microsphere being coated. The above-recited three adjustments can be made, provided that the height of the GMB stays within about ½ to about 1 GMB diameter above the bottom of the CHS.

EXAMPLES

The following examples were carried out, the first five examples illustrating various embodiments of the invention and using apparatus which was illustrated schematically in FIG. 3. Example 6 is a control run wherein levitation was not used, the required motion having been supplied instead by bouncing the microspheres, as described below.

In all the examples, the sputtering means was a Sloan (3-inch) ring-type Sputter Gun ® and was used with a Varian 1-kw rf power supply. This is a magnetron type down-firing gun which has been described in detail (for example, in D. B. Fraser and H. D. Cook, J. Vac. Sci. Technol. 14 147 (1977)). The motion of the microsphere was observed from outside the vacuum chamber with a Questar telescope. Illumination of the microspheres was maintained throughout the runs with a 4-mW HeNe laser, the beam of which passed through a second viewport and was focused onto the GMB's with mirrors inside the sputtering chamber. Argon was used as the sputtering gas.

In Examples 1-5, argon was used both as the sputtering gas and as the levitation gas. The CHS's were obtained from Brunswick Corp., and dimples were machined therein by electrical discharge machining. The CHS was positioned 3 in. below the sputtering source. The diameter of each CHS was 0.250 in., the length of each individual gas outlet in each CHS was 0.125 in., and the diameter of each individual gas outlet was 50 $\mu$m.

EXAMPLE 1

In this example, gold was coated onto a GMB having a diameter of 200 $\mu$m with a 1 $\mu$m thick wall, the thickness of the coating being 1 $\mu$m. The procedure for coating GMB's, as described above, was used. As coating progressed, the levitation flow rate was increased, the total chamber pressure was decreased, the rf power was increased, and the deposition rate increased. Specific variables at the start of levitation, at the start of the deposition, and at the end of the deposition are given in Table I. These data are fairly representative of data obtained for coating several GMB's, each with a thickness of about 1 $\mu$m.

TABLE I

| Variable | Start of Levitation | Start of Deposition | End of Deposition (1 $\mu$m thick coating) |
|---|---|---|---|
| Levitation flow rate | 0.05 cc/min. | 0.1 cc/min. | 0.4 cc/min. |
| Total chamber pressure | 200 mTorr | 100 mTorr | 30 mTorr |
| rf power | 0 | 300 watts | 500 watts |
| Deposition rate | 0 | 20 Å/min. | 150 Å/min. |
| Weight of GMB plus weight of coating | .3 $\mu$g | .3 $\mu$g | 2.3 $\mu$g |

Photomicrographs were made, and uniformity of the thickness of this coating was measured to be to within ±3%.

EXAMPLE 2

In this example, a 3.5 $\mu$m thick coating of gold was deposited onto a GMB using the procedure described above. The GMB had a diameter of 200 $\mu$m with a 1 $\mu$m thick wall. The same values for variables shown in columns 2 and 3 of Table I (for the start of levitation and for the start of deposition) were also used in this example. The uniformity of the coating was to within ±5%. At the end of the coating run, the levitation gas flow rate was 1.4 cc/min., the coated GMB weighed 8.5 micrograms, the rf power was 500 W, the deposition rate was 144 Å/min, and the total chamber pressure was about 28 mTorr.

EXAMPLE 3

Using CHS's as described above, variations in dimensions of dimples were investigated. It was found that the most stable levitation of GMB's was obtained when the diameter of the dimple was 0.160 inch and the depth of the dimple was 0.065 inch. For such a dimple, using one particular GMB (having a diameter of 200 $\mu$m and a mass of 0.3 $\mu$g), the height of stable levitation of that GMB above the bottom of the dimple for various chamber pressures was investigated. At 200 mTorr, the GMB was still stable at 3 GMB diameters above the bottom surface of the CHS. At 100 mTorr, the GMB was stable at about 1 GMB diameter above the bottom surface of the CHS, but no higher. However, at a total chamber pressure of one atmosphere, the GMB was stable when levitated up to ⅛ inch above the bottom surface of the CHS.

EXAMPLE 4

In this example, a microsphere which was much heavier (about 1000 times heavier) than a GMB was coated. A solid sphere made of 3% beryllium and 97% copper and having a mass of 0.3 mg and a diameter of 500 micrometers was coated with a layer of gold which was 2.5±0.2 micrometers thick. The miscrosphere was placed in a dimple which was only slightly larger in diameter than the diameter of the sphere. A levitating gas flow sufficient to levitate the sphere so that it would spin like an air bearing was applied. This flow was 1 to 5 cubic centimeters per minute and produced a chamber pressure of 20 mTorr. The uniformity of the coating was to within ±8%.

EXAMPLE 5

In this example a DT-filled GMB was coated. The uncoated GMB had a diameter of 200 $\mu$m with a 1 $\mu$m thick wall and had a mass of about 0.3 $\mu$g. The DT was inserted into the GMB by diffusing it through the walls of the GMB at elevated temperature and pressure. A layer of gold about 1 $\mu$m thick was coated onto the GMB. The coating conditions were similar to those given in Table I. There were no adverse effects due to having DT located within the GMB.

EXAMPLE 6 (CONTROL)

In this example, GMB's were coated in apparatus which was the same as that used in Examples 1–5, except that the motion of the GMB's was provided by a vibratory table, instead of levitation. The Table was $2\frac{3}{4}$ inches below the sputtering source and was a 3 inch diameter aluminum dish driven with a Bruel and Kjaer Minishaker. A function generator driving an amplifier permitted a continuous frequency sweep of the vibration. The driver was run at low frequencies (near 40 Hz), and maximum sweep was between 20 and 60 Hz. At different frequencies, nodes formed in the table, sweeping the microspheres laterally across the table in addition to bouncing. Coatings of molybdenum, tungsten, and palladium were obtained on GMB's by sputter deposition. A typical deposition rate for these materials was 250 Å per minute at 600 watts rf power and argon pressure of 18 mTorr. For 1 to 2 micrometer-thick coatings, uniformity was within ±0.2 micrometers. Although in this technique, thousands of GMB's can be coated in one run, several disadvantages severely restrict the usefulness of this technique. Breakage of GMB's is high due to the bouncing. Furthermore, the stresses induced by the bouncing often caused the coatings to crack. Furthermore, surface smoothness and cleanliness were difficult to obtain for coated GMB's which continuously collided with other GMB's and with the surface of the vibrating table.

Thus, in comparing Example 6 with Examples 1–5, the benefits which are obtainable by using levitation and sputtering can be clearly seen. These benefits include minimal breakage, clean and uniform coatings, and no sticking together of GMB's in a process wherein an individual single GMB can be observed.

The foregoing description of preferred embodiments of the invention has been presented for purposes of illustration and description and is not intended to be exhaustive or to limit the invention to the precise forms disclosed. They were chosen and described in order to best explain the principles of the invention and their practical application to thereby enable others skilled in the art to best utilize the invention in various embodiments and with various modifications as are suited to the particular use contemplated. It is intended that the scope of the invention be defined by the claims appended hereto.

What is claimed is:

1. A method of coating a microsphere with a substantially uniform coating of at least one coating material selected from the group consisting of metals and nonmetals, said method comprising:

a. levitating said microsphere over a dimple hollowed out in a collimated hole structure comprising an array of parallel linear gas outlets by passing at least one levitating gas through said array; and
b. simultaneously sputtering said coating material onto said microsphere.

2. A method according to claim 1 wherein said microsphere is hollow and is made of glass and including also a preliminary step of coating said microsphere with an anti-static agent.

3. A method according to claim 2, wherein said sputtering takes place at a total chamber pressure less than about 90 mTorr but greater than about 30 mTorr.

4. A method according to claim 3, wherein said at least one levitating gas is argon, wherein said levitating gas is passed through said array at a total flow rate at the beginning of coating which is within the range from about 0.1 to about 0.2 cubic centimeters per minute, and wherein said flow rate of levitating gas and said total chamber pressure are adjusted so as to maintain said microsphere at a height above the bottom of said collimated hole structure which is within the range from about $\frac{1}{2}$ to about 1 glass microballoon diameter while said microsphere is being coated.

5. A method according to claim 4, wherein said sputtering is produced by a sputtering means which ionizes a sputtering gas present in the atmosphere surrounding said sputtering means so as to produce a plasma and wherein said microsphere is separated from said sputtering means by a grounded grid so as to minimize the effect of said plasma on said microsphere while said microsphere is being coated.

6. An apparatus suitable for sputter deposition comprising:

a. a collimated hole structure comprising a parallel array of a multiplicity of upwardly projecting gas jet outlets, wherein at least one dimple adapted to levitate a single microsphere is hollowed out from said collimated hole structure;
b. a sputtering means for sputtering a material, said sputtering means being located above said dimple;
c. a supply means for supplying a levitating gas through said parallel array of gas jet outlets so as to levitate a microsphere when said microsphere is placed near said dimple;
d. a housing for enclosing said collimated hole structure, said sputtering means, and said supply means; and
e. a vacuum means for reducing the total pressure within said housing.

7. An apparatus comprising the apparatus according to claim 6 and including also a grounded grid positioned within said housing between said collimated hole structure and said sputtering means.

8. An apparatus according to claim 7 and including also in operable communication therewith a viewing system comprising a telescope, a television camera, and a television monitor.

* * * * *